United States Patent
Vukkadala et al.

(10) Patent No.: US 10,576,603 B2
(45) Date of Patent: Mar. 3, 2020

(54) PATTERNED WAFER GEOMETRY MEASUREMENTS FOR SEMICONDUCTOR PROCESS CONTROLS

(71) Applicant: KLA-Tencor Corporation, Milpitas, CA (US)

(72) Inventors: Pradeep Vukkadala, Fremont, CA (US); Jaydeep Sinha, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1113 days.

(21) Appl. No.: 14/313,733

(22) Filed: Jun. 24, 2014

(65) Prior Publication Data

US 2015/0298282 A1 Oct. 22, 2015

Related U.S. Application Data

(60) Provisional application No. 61/982,731, filed on Apr. 22, 2014.

(51) Int. Cl.
| | |
|---|---|
| *G01B 21/00* | (2006.01) |
| *G03F 7/20* | (2006.01) |
| *B24B 37/005* | (2012.01) |
| *B24B 49/00* | (2012.01) |
| *G06N 20/00* | (2019.01) |

(Continued)

(52) U.S. Cl.
CPC ............ *B24B 37/005* (2013.01); *B24B 49/00* (2013.01); *G01B 21/00* (2013.01); *G03F 7/705* (2013.01); *G03F 9/7026* (2013.01); *G06N 7/00* (2013.01); *G06N 20/00* (2019.01); *G01B 2210/48* (2013.01)

(58) Field of Classification Search
CPC ......... H01L 22/00; H01L 22/10; H01L 22/12; G03F 7/705
USPC ............. 438/14, 16, 17; 451/5, 8–10, 41, 57
See application file for complete search history.

(56) References Cited

U.S. PATENT DOCUMENTS

| | | | |
|---|---|---|---|
| 8,255,172 B2 | 8/2012 | Auerbach | |
| 8,340,801 B2 * | 12/2012 | Pitney | ............... G01B 21/30 700/105 |
| 2003/0186624 A1 | 10/2003 | Koike et al. | |

(Continued)

FOREIGN PATENT DOCUMENTS

| | | |
|---|---|---|
| JP | 2002018701 A | 1/2002 |
| JP | 3316833 B2 | 8/2002 |

(Continued)

OTHER PUBLICATIONS

PCT International Search Report for International Application No. PCT/US2015/027182, dated Jul. 29, 2015, 4 pages.

(Continued)

*Primary Examiner* — Monica S Carter
*Assistant Examiner* — Marcel T Dion
(74) *Attorney, Agent, or Firm* — Suiter Swantz pc llo

(57) ABSTRACT

Wafer geometry measurement tools and methods for providing improved wafer geometry measurements are disclosed. Wafer front side, backside and flatness measurements are taken into consideration for semiconductor process control. The measurement tools and methods in accordance with embodiments of the present disclosure are suitable for handling any types of wafers, including patterned wafers, without the shortcomings of conventional metrology systems.

27 Claims, 8 Drawing Sheets

(51) Int. Cl.
*G03F 9/00* (2006.01)
*G06N 7/00* (2006.01)

(56) References Cited

U.S. PATENT DOCUMENTS

| | | |
|---|---|---|
| 2004/0185662 A1 | 9/2004 | Fujisawa et al. |
| 2004/0190008 A1* | 9/2004 | Mieher ................ G01N 21/956 356/625 |
| 2004/0235205 A1* | 11/2004 | Levy .................... G01N 21/211 438/14 |
| 2004/0239905 A1* | 12/2004 | Van Rhee ........... G03F 7/70508 355/55 |
| 2005/0128456 A1 | 6/2005 | Nelson et al. |
| 2005/0185170 A1* | 8/2005 | Lin ..................... G03F 7/70533 356/237.1 |
| 2005/0221514 A1* | 10/2005 | Pasadyn ................ G05B 11/42 438/14 |
| 2005/0255610 A1 | 11/2005 | Sato et al. |
| 2006/0142971 A1* | 6/2006 | Reich ..................... G01C 17/00 702/150 |
| 2006/0234139 A1* | 10/2006 | Watson ..................... G03F 1/72 430/5 |
| 2007/0009814 A1* | 1/2007 | Oesterholt .......... G03F 7/70508 430/30 |
| 2007/0020784 A1* | 1/2007 | Timans ................. G01J 5/0003 438/16 |
| 2008/0131796 A1* | 6/2008 | Werner ............... G03F 7/70625 430/30 |
| 2009/0157577 A1* | 6/2009 | Chauhan ................ G03F 7/705 706/16 |
| 2010/0248398 A1* | 9/2010 | Wang ................... H01L 21/6831 438/14 |
| 2011/0172982 A1 | 7/2011 | Veeraraghavan et al. |
| 2013/0279796 A1* | 10/2013 | Kaizerman ............ G06K 9/033 382/149 |
| 2013/0304399 A1 | 11/2013 | Chen et al. |
| 2014/0075399 A1 | 3/2014 | Cho et al. |
| 2014/0127836 A1* | 5/2014 | Hsu .......................... G03F 1/00 438/14 |

FOREIGN PATENT DOCUMENTS

| | | |
|---|---|---|
| JP | 2010529659 A | 8/2010 |
| JP | 2011249627 A | 12/2011 |
| JP | 2013527972 A | 7/2013 |
| TW | 1282913 B | 6/2007 |
| TW | 201346593 A | 11/2013 |

OTHER PUBLICATIONS

TW Office Action dated May 18, 2018 for Taiwan Patent Application No. 104114780.

Office Action dated Mar. 5, 2019 for Japanese Patent Application No. 2016-575021.

* cited by examiner

PATTERNED WAFER GEOMETRY MEASUREMENTS FOR SEMICONDUCTOR PROCESS CONTROLS

CROSS-REFERENCE TO RELATED APPLICATIONS

The present application claims the benefit under 35 U.S.C. § 119(e) of U.S. Provisional Application Ser. No. 61/982,731, filed Apr. 22, 2014. Said U.S. Provisional Application Ser. No. 61/982,731 is hereby incorporated by reference in its entirety.

TECHNICAL FIELD

The disclosure generally relates to the field of semiconductors, and particularly to wafer geometry measurement techniques.

BACKGROUND

Fabricating semiconductor devices typically includes processing a substrate such as a semiconductor wafer using a number of semiconductor fabrication processes. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. Some of these characteristics include the flatness and thickness uniformity of the wafers. While conventional metrology systems may be able to monitor and control these characteristics, they are generally utilized for handling unpatterned/bare wafers. Therein lies a need for systems and methods for wafer geometry measurements suitable for any wafers, including patterned wafers, without the aforementioned shortcomings.

SUMMARY

The present disclosure is directed to a method for monitoring and controlling a wafer polishing process. The method includes: obtaining a first set of wafer geometry measurements of a wafer prior to the wafer polishing process, the first set of wafer geometry measurements including: a first front side height measurement, a first backside height measurement, and a first wafer flatness measurement; optimizing the wafer polishing process for the wafer, wherein different pressure levels are assigned to different areas of the wafer to achieve a best-flatness condition, wherein the best-flatness condition for the wafer is calculated based on the first front side height measurement, the first backside height measurement and the first wafer flatness measurement obtained prior to the wafer polishing process; and polishing the wafer based on the optimized wafer polishing process.

A further embodiment of the present disclosure is directed to a method for analyzing process tool induced flatness errors. The method includes: obtaining wafer geometry measurements of a wafer, the wafer geometry measurements including at least: a front side height measurement and a backside height measurement; identifying front side wafer surface signatures based on the front side height measurement; identifying backside wafer surface signatures based on the backside height measurement; separating flatness errors induced by the front side wafer surface signatures from flatness errors induced by the backside wafer surface signatures; and determining whether a process tool induced flatness errors independently based on flatness errors induced by the front side wafer surface signatures and flatness errors induced by the backside wafer surface signatures.

An additional embodiment of the present disclosure is directed to a method for controlling lithography focus errors. The method includes: obtaining a first set of wafer geometry measurements of a wafer prior to lithography scanning, the first set of wafer geometry measurements including: a first front side height measurement, a first backside height measurement, and a first wafer flatness measurement; identifying at least one wafer flatness error; and controlling a lithography scanner to compensate for the at least one wafer flatness error during lithography scanning.

An additional embodiment of the present disclosure is directed to a method for calculating wafer variations. The method includes: obtaining a wafer-level thickness variation map; dividing the wafer-level thickness variation map into a plurality of uniform sized sites; independently leveling each site of the plurality of sites; further dividing each site into a plurality of rectangular areas, wherein each rectangular area generally corresponds to a slit-size of a lithography scanner; independently leveling each rectangular area of the plurality of rectangular areas for each site of the plurality of sites; and combining the plurality of rectangular areas of each site of the plurality of sites to obtain a full wafer measurement metric.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments of the present disclosure are directed to systems and methods for providing improved wafer geometry measurements for lithography focus, CMP, and other semiconductor process control scanner corrections. It is noted that the term wafer geometry in the present disclosure refers to wafer front side height, backside height, thickness variation, flatness, and all consequent derivatives such as shape, topography, or the like. It is also noted that the systems and methods in accordance with embodiments of the present disclosure are suitable for handling any types of wafers, including patterned wafers, without the shortcomings of conventional metrology systems.

Figure 1:
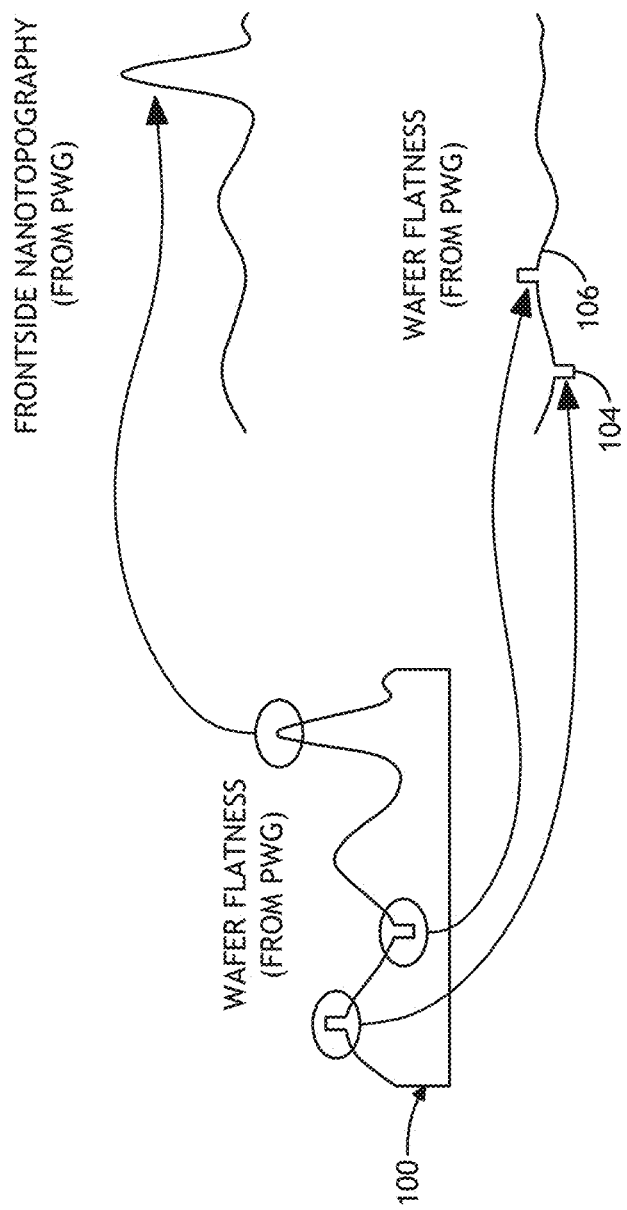
FIG. 1 is an illustration depicting a wafer flatness measured on a patterned wafer geometry measurement tool.

Referring to FIG. 1, a wafer flatness measured on a patterned wafer geometry (PWG) measurement tool is shown. A patterned wafer geometry measurement tool utilized in accordance with the present disclosure is a measurement tool that is able to measure front side height, back side height, and thickness variation of the wafer. Obtaining such information allows the sources of flatness errors to be separated and attributed to front side and backside components.

The ability to identify the sources of flatness errors is important. For instance, referring to FIG. 2, a simplified illustration depicting a wafer 200 being polished by a polishing tool (e.g., CMP) is shown. Suppose that the shape of the wafer 200 before going through the polishing process is slightly curved as shown, the polishing tool will then remove the raised portions of the top surface, resulting in a polished wafer 202 with a flat front side. However, this polished wafer 202 is undesirable because its flatness profile is suboptimal.

Figure 2:
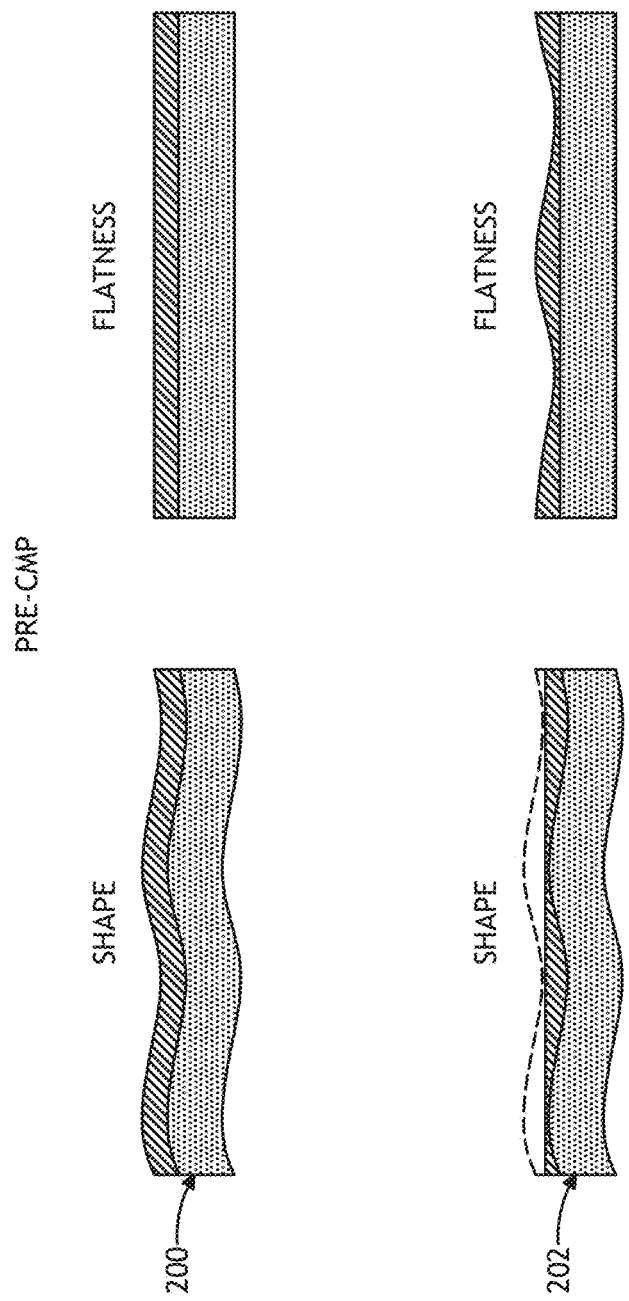
FIG. 2 is an illustration depicting a wafer polishing process.
Figure 3:
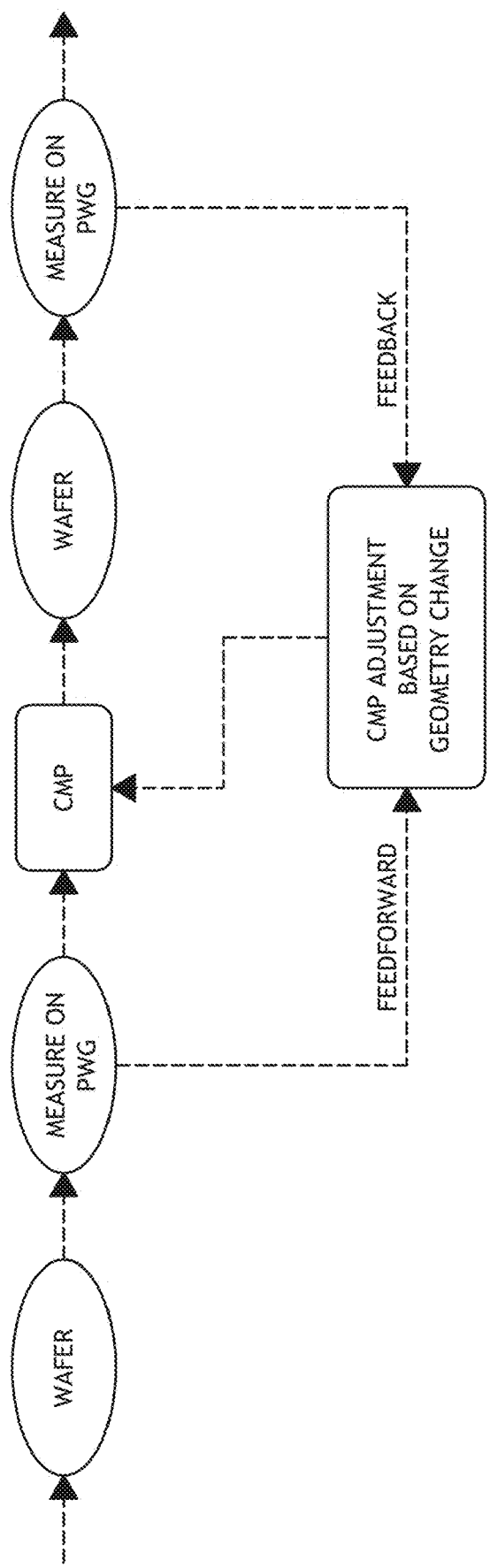
FIG. 3 is a block diagram depicting a wafer geometry measurement based control loop for a wafer polishing process.

Instead of simply removing the raised portions of the top surface, wafer geometry and flatness data should be measured and taken into consideration for the polishing process. FIG. 3 is an illustration depicting such a control loop. More specifically, the separate front side and backside topography measurement data can be obtained and fed to the control loop to optimize the polishing process. For instance, the control loop may calculate a best-flatness condition that can be achieved if the wafer is polished in a certain manner. Subsequently, different pressure levels can be applied to different areas of the wafer so that the best-flatness condition can be achieved as an end result, as opposed to simply providing a flat top surface of the polished wafer 202 as depicted in FIG. 2. In addition, wafer geometry measurements can be taken again after the polishing process; and adjustments necessary can be determined and applied to the polishing process accordingly.

It is contemplated that configuring the polishing tool in this manner to optimize for the best-flatness condition is beneficial for downstream processes. For example, a polished wafer will be held on a vacuum or a chuck using force when it is processed by a lithography process tool or the like. It is noted that when the wafer is held on a chuck using force, the wafer backside is expected to be substantially flattened, and if the wafer was simply polished to provide a flat top surface, the top surface may no longer be flat when the wafer is chucked. Focus errors may be introduced as a result. Since wafer flatness errors directly contribute to focus errors during lithography exposure, configuring the polishing tool based on optimizing flatness conditions as described above effectively improves focus of the lithography process tool.

It is also contemplated that when the wafer is chucked, features such as 104 and 106 (as shown in FIG. 1) that are induced by the wafer backside are pushed towards the front side and are presented to the lithography process tool along with the features that are induced by the wafer front side. While certain lithography process tools are capable of making adjustments based on wafer flatness to compensate for errors, it is noted that these adjustments are made without distinguishing between the front side induced flatness errors and the backside induced flatness errors. Therefore, adjustments made in this manner are not ideal because once the wafer is unchucked, compensations made while the wafer was chucked may turn out to be over-corrected or under-corrected.

With the ability to separate the front side topography from the backside topography, as shown in FIG. 1, the sources of flatness errors can be isolated. In the example shown in FIG. 1, once it is observed that the backside has distinct signatures (pin-type marks) 104 and 106, a subsequent process step may be notified of this observation (e.g., in a feedforward manner) and the subsequent process step may choose to compensate for (or avoid) such flatness errors accordingly.

In addition to providing a better compensation control mechanism, separating the front side topography from the backside topography can also help identify process steps that may have caused front side and/or backside flatness errors during the manufacturing process. In the example shown in FIG. 1, once it is determined that the signatures (pin-type marks) 104 and 106 are induced by the backside, an analysis process may be invoked to find the cause of such signatures. In one embodiment, this analysis process (may be referred to as a cause analysis or root cause analysis) may attempt to identify which process step(s) during the manufacturing process caused these errors and by how much. For instance, this analysis process may take wafer geometry measurements at suspected process steps and identify the process step(s) that caused the backside signatures. It is contemplated that this process may also be utilized to analyze the front side errors as well without departing from the spirit and scope of the present disclosure.

Figure 4:
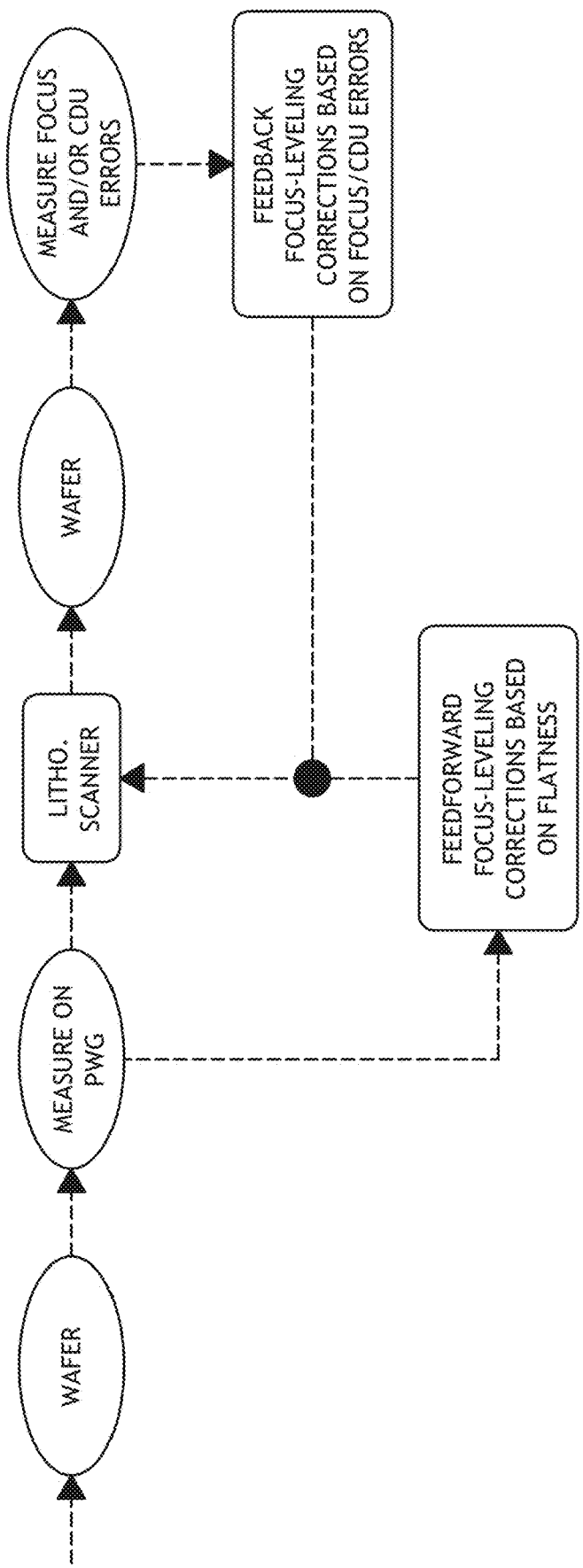
FIG. 4 is block diagram depicting a wafer geometry measurement based control loop for a lithography scanner.

FIGS. 3 and 4 are illustrations depicting control loops that may be utilized to analyze/assess wafer geometry variations induced by various types of process steps. By measuring wafer geometry at two points, i.e., before and after a process of interest, the variations induced by that particular process step to wafer geometry can be assessed. The measured changes in wafer geometry may be related to impact on critical semiconductor fabrication parameters such as lithography focus and overlay errors, and yield by way of metrics such as site-flatness, in-plane displacement and the like that may be computed from the measured wafer geometry changes.

It is contemplated that such an analysis process may be utilized in every critical process steps during the manufacturing process to catch potential errors as soon as possible. Alternatively or additionally, this analysis process may be conditionally invoked when certain signatures are detected on either the front side or the backside. As previously mentioned, in the example shown in FIG. 1, when the signatures (pin-type marks) 104 and 106 are detected on the backside of the wafer 100, this detection may prompt further analysis to find the cause of such signatures. Furthermore, it may be configured to manually and/or automatically adjust process step conditions for a particular process tool and thereby minimize the impact of that particular process tool on wafer geometry and certain critical semiconductor fabrication parameters.

Figure 5:
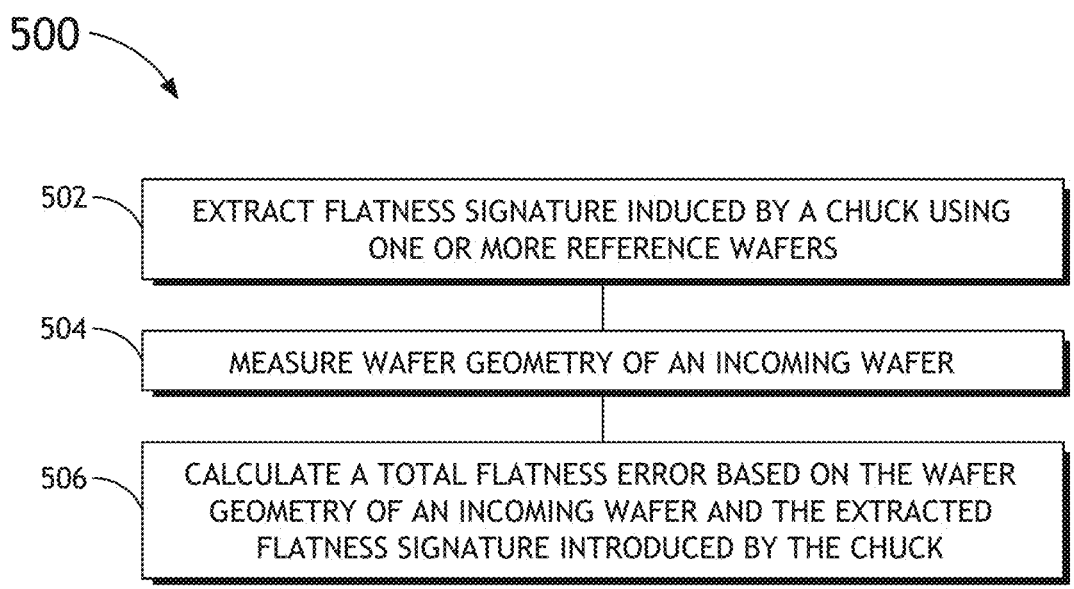
FIG. 5 is a flow diagram depicting a method for estimating flatness errors that takes flatness signatures of a lithography chuck into consideration.

In addition to providing abilities to identify and to compensate for flatness errors, flatness signatures induced by a chuck can also be extracted and used to calculate/estimate a total flatness error of an incoming wafer. More specifically, FIG. 5 shows a methodology 500 in which wafer flatness measurements obtained using a wafer geometry tool and scanner leveling measurements obtained from the lithography scanner can be used to calculate/estimate flatness errors. It is contemplated that patterned wafers or unpatterned bare wafers (serving as reference wafers) may be used to extract the flatness signature induced by a given chuck in step 502. Once the flatness signature of the given chuck has been extracted, total flatness errors during lithography exposures for future wafers chucked on that same chuck may be estimated. For example, when a new wafer is received, its wafer geometry, including its measured flatness, can be obtained in step 504 using a wafer geometry tool. Subsequently, by adding the extracted chuck flatness signature to the measured flatness of that wafer, the total flatness error (representing the flatness errors when the wafer is chucked) can be calculated in step 506. In this manner, the effects of forcing the wafer onto the chuck can be quantified (e.g., as a part of the feedforward control), which can help provide better focus leveling corrections.

It is noted that this calculation is also fully reversible. That is, if the height of the top surface is measured when the wafer is chucked on a particular chuck (e.g., based on scanner leveling measurements), and if the wafer geometry has been measured when the wafer was in an unchucked state, the flatness signature of that particular chuck can be calculated by subtracting the measured wafer geometry from the leveling map obtained from the lithography scanner. As previously mentioned, this process can be carried out using reference wafers in a controlled manner, and the extracted flatness signature of that particular chuck can be used to predict/estimate its effects on future wafers. In addition, the accuracy of this estimation process can be improved utilizing a feedback loop (e.g., as shown in FIG. 4). More specifically, focus error and/or critical dimension uniformity can be measured post-lithography to check how well the feedforward focus corrections worked. If it is determined that the feedforward alone did not sufficiently reduce focus and/or critical dimension uniformity errors, then the feedback loop may be employed that will adjust the focus corrections for the next wafer.

It is also contemplated that additional measurement metrics may also be obtained and provided as control signals. For instance, in one embodiment, a site-based flatness variation metric is obtained, which can be used to perform root cause analysis and/or provided as feedback to improve the manufacturing processes.

Figure 6:
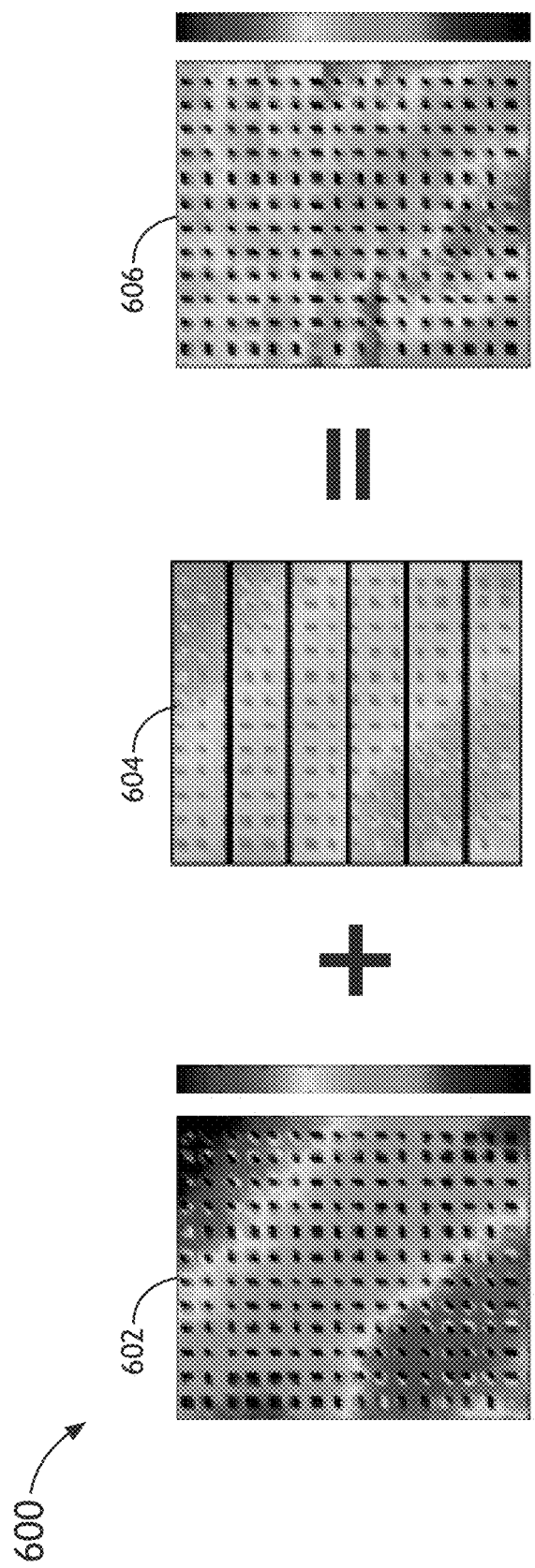
FIG. 6 is an illustration depicting a site-based flatness variation calculation process.
Figure 7:
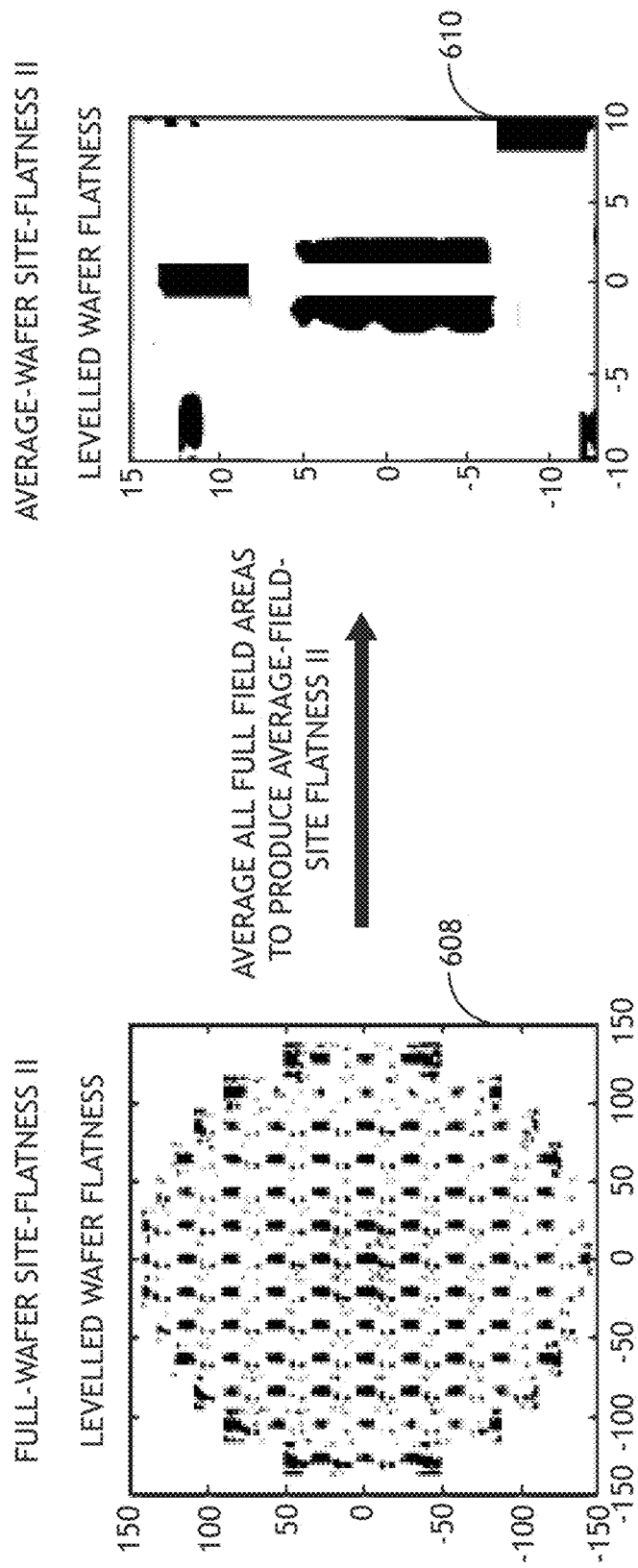
FIG. 7 is an illustration that continues the depiction of the site-based flatness variation calculation process.
Figure 8:
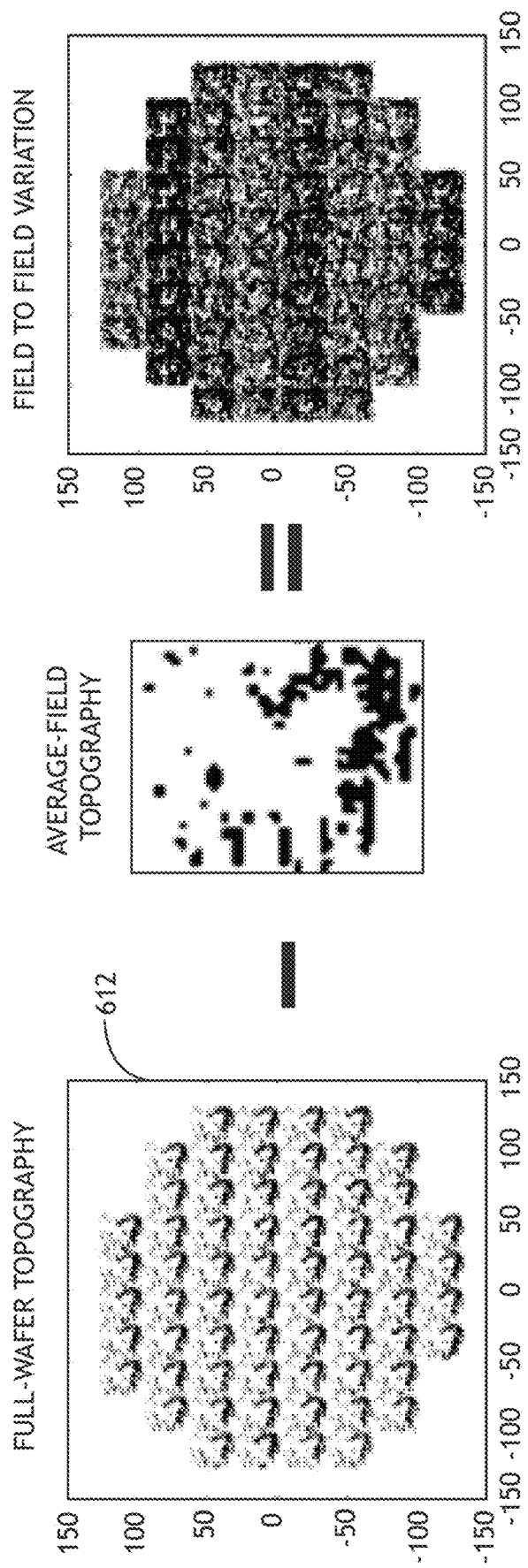
FIG. 8 is an illustration that continues the depiction of the site-based flatness variation calculation process.

Referring to FIGS. 6 through 8, a series of illustrations depicting a site-based flatness variation calculation process 600 is shown. In step 602, a wafer-level thickness variation map is obtained and divided into a plurality of uniform sized sites (may also be referred to as fields). The thickness variation within each particular site is then leveled by fitting a single least-square best-fit plane to that particular site. In step 604, each site is further divided into rectangular areas generally equivalent to the slit-size of the lithography scanner. It is understood that if a site cannot be evenly divided by the slit-size, a partial slit may be utilized on one end of the site, or the slit-size may be slightly adjusted to evenly divide the site. It is noted that one of the advantages provided by dividing the sites in this manner is that it simulates the scanning process, which is done in a slit-by-slit manner.

Now, each slit-area can be further leveled independently by fitting a single least-square best-fit plane to that particular slit-area in step 606, and the independently leveled slit-areas within each site can be combined to form a full wafer map (e.g., representing industry standard metrics such as site frontside least squares focal plane, or SFQ and the like) in step 608. Subsequently, an average site-flatness value is taken by averaging all site-flatness values in step 610. It is noted that this average site-flatness value is leveled utilizing both conventional site-wise leveling and slit-by-slit leveling (which has the advantage of simulating the scanning process) as described above.

It is contemplated that the average site-flatness value calculated in this manner can be utilized to compute various derived metrics and information regarding a given wafer. For instance, by subtracting the average value from each site-based value, as shown in step 612, a site-to-site variation map can be calculated for the full wafer. It is also contemplated that while flatness values are used as exemplary measurement metrics, this site-based, slit-by-slit variation calculation process is applicable for calculation of various other types of measurement metrics, including, but not limited to, flatness variations, thickness variations, as well as various other types of wafer topography variations that correlate to non-correctable focus errors seen by the lithography scanner during wafer exposure.

It is also contemplated that these variation maps can be used for reporting purposes, and can also be analyzed to improve the manufacturing processes. For example, in the site-to-site variation map shown in FIG. 8, the topography variation (which is systematic) coming from the device pattern is removed. Thereby any process variability (such as a local hot-spot created by a polishing tool) becomes visible after the systematic topography is removed. This information can then be provided as a feedback control to the polishing tool, thereby improving future processes.

It is further contemplated that the average-site and site-to-site variation maps and metrics are not limited to flatness measurements. The same techniques described above are also applicable to other metrics for front side and/or back-side maps such as front and/or back nanotopography and the like without departing from the spirit and scope of the present disclosure.

It is contemplated that while the examples above referred to polishing tools and lithography tools, the systems and methods in accordance with the present disclosure are applicable to other types of process tools, which may also benefit from the wafer geometry based control loops without departing from the spirit and scope of the present disclosure. Furthermore, the term wafer used in the present disclosure may include a thin slice of semiconductor material used in the fabrication of integrated circuits and other devices, as well as other thin polished plates such as magnetic disc substrates, gauge blocks and the like.

The methods disclosed may be implemented in various wafer geometry measurement tools as sets of instructions executed by one or more processors, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method for analyzing process tool induced flatness errors, the method comprising:
    obtaining a wafer geometry measurement of a front surface of a wafer;
    identifying front side wafer surface signatures of the front surface of the wafer in the wafer geometry measurement of the front surface of the wafer;
    identifying backside wafer surface signatures of a back surface of the wafer in the wafer geometry measurement of the front surface of the wafer;
    separating front side flatness errors induced by the front side wafer surface signatures of the front surface in the wafer geometry measurement of the front surface of the wafer from backside flatness errors induced by the backside wafer surface signatures of the back surface of the wafer in the wafer geometry measurement of the front surface of the wafer; and
    determining whether at least one of the front side flatness errors or the backside flatness errors is induced by a process tool.

2. The method of claim 1, wherein the wafer geometry measurement of the front surface of the wafer is a first wafer geometry measurement of the front surface of the wafer obtained before processing the wafer using the process tool, wherein an additional wafer geometry measurement of the front surface of the wafer is obtained after processing the wafer using the process tool.

3. The method of claim 2, wherein the front side wafer surface signatures of the front surface of the wafer are identified based on a front side height of the first wafer geometry measurement of the front surface of the wafer and a front side height of the additional wafer geometry measurement of the front surface of the wafer, wherein the backside wafer surface signatures of the back surface of the wafer are identified based on a backside height of the first wafer geometry measurement of the front surface of the wafer and a backside height of the additional wafer geometry measurement of the front surface of the wafer.

4. A method for controlling lithography focus errors, the method comprising:
    obtaining a wafer geometry measurement of a front surface of a wafer prior to lithography scanning;
    identifying at least one wafer flatness error from the wafer geometry measurement of the front surface of the wafer, wherein the identifying the at least one wafer flatness error comprises:
        identifying front side wafer surface signatures of the front surface of the wafer in the wafer geometry measurement of the front surface of the wafer;
        identifying backside wafer surface signatures of a back surface of the wafer in the wafer geometry measurement of the front surface of the wafer;
        separating front side flatness errors induced by the front side wafer surface signatures of the front surface in the wafer geometry measurement of the front surface of the wafer from backside flatness errors induced by the backside wafer surface signatures of the back surface in the wafer geometry measurement of the front surface of the wafer; and
        determining whether at least one of the front side flatness errors or the backside flatness errors is induced by a lithography scanner; and
    controlling the lithography scanner to compensate for the at least one wafer flatness error during lithography scanning.

5. The method of claim 4, wherein the wafer geometry measurement of the front surface of the wafer includes at least a wafer flatness, wherein the identifying the at least one wafer flatness error further comprises:
    estimating at least one lithography chuck induced flatness error; and
    calculating a total wafer flatness error based on the at least one lithography chuck induced flatness error and the wafer flatness.

6. The method of claim 5, wherein the at least one lithography chuck induced flatness error is estimated by subtracting wafer geometry of a reference wafer measured in an unchucked state from a leveling map of the reference wafer obtained from the lithography scanner when the reference wafer is chucked.

7. The method of claim 4, further comprising:
    obtaining at least one of a focus error or a critical dimension uniformity after lithography scanning.

8. The method of claim 7, further comprising:
    determining an effectiveness of said controlling the lithography scanner to compensate for the at least one wafer flatness error during lithography scanning based on said at least one of the focus error or the critical dimension uniformity obtained after lithography scanning; and
    adjusting the lithography focus based on said at least one of the focus error of the critical dimension uniformity obtained after lithography scanning.

9. The method of claim 4, wherein the identifying the at least one wafer flatness error further comprises:
    obtaining a wafer-level thickness variation map;
    dividing the wafer-level thickness variation map into a plurality of uniform sized sites;
    independently leveling each site of the plurality of sites;
    further dividing each site into a plurality of rectangular areas, wherein each rectangular area generally corresponds to a slit-size of the lithography scanner;
    independently leveling each rectangular area of the plurality of rectangular areas for each site of the plurality of sites; and
    combining the plurality of rectangular areas for each site of the plurality of sites to obtain a full wafer measurement metric.

10. The method of claim 9, wherein independently leveling each site of the plurality of sites comprises fitting a single least-square best-fit plane to each site.

11. The method of claim 9, wherein independently leveling each rectangular area of the plurality of rectangular areas for each site of the plurality of sites comprises fitting a single least-square best-fit plane to each rectangular area.

12. The method of claim 9, wherein the measurement metric includes a flatness measurement metric.

13. The method of claim 12, further comprising:
    calculating an average site-flatness value based on the combined full wafer flatness measurement metric.

14. The method of claim 13, further comprising:
subtracting the average site-flatness value from the combined full wafer flatness measurement metric to obtain a site-to-site variation.

15. The method of claim 14, further comprising:
providing the site-to-site variation as a feedback control to a process tool to reduce process tool induced flatness errors.

16. A system comprising:
a patterned wafer geometry measurement tool; and
one or more processors configured to execute a set of instructions, wherein the set of instructions are configured to cause the one or more processors to:
  obtain, from the patterned wafer geometry tool, a wafer geometry measurement of a front surface of a wafer prior to lithography scanning;
  identify at least one wafer flatness error from the wafer geometry measurement of the front surface of the wafer, wherein the set of instructions are further configured to cause the one or more processors to:
    identify front side wafer surface signatures of the front surface of the wafer in the wafer geometry measurement of the front surface of the wafer;
    identify backside wafer surface signatures of a back surface of the wafer in the wafer geometry measurement of the front surface of the wafer;
    separate front side flatness errors induced by the front side wafer surface signatures of the front surface of the wafer in the wafer geometry measurement of the front surface of the wafer from backside flatness errors induced by the backside wafer surface signatures of the back surface of the wafer in the wafer geometry measurement of the front surface of the wafer; and
    determine whether at least one of the front side flatness errors or the backside flatness errors is induced by a lithography scanner; and
  control the lithography scanner to compensate for the at least one wafer flatness error during lithography scanning.

17. The system of claim 16, wherein the wafer geometry measurement of the front surface of the wafer includes at least a wafer flatness, wherein the one or more processors identify at least one wafer flatness error further by:
estimating at least one lithography chuck induced flatness error; and
calculating a total wafer flatness error based on the least one lithography chuck induced flatness error and the wafer flatness.

18. The system of claim 17, wherein the at least one lithography chuck induced flatness error is estimated by subtracting wafer geometry of a reference wafer measured in an unchucked state from a leveling map of the reference wafer obtained from the lithography scanner when the reference wafer is chucked.

19. The system of claim 16, wherein the one or more processors are further configured to:
obtain at least one of a focus error or a critical dimension uniformity after lithography scanning.

20. The system of claim 19, wherein the one or more processors are further configured to:
determine an effectiveness of said controlling the lithography scanner to compensate for the at least one wafer flatness error during lithography scanning based on said at least one of the focus error or the critical dimension uniformity obtained after lithography scanning; and
adjust the lithography focus based on said at least one of the focus error or the critical dimension uniformity obtained after lithography scanning.

21. The system of claim 16, wherein the one or more processors identify at least one wafer flatness error by:
obtaining a wafer-level thickness variation map;
dividing the wafer-level thickness variation map into a plurality of uniform sized sites;
independently leveling each site of the plurality of sites;
further dividing each site into a plurality of rectangular areas, wherein each rectangular area generally corresponds to a slit-size of the lithography scanner;
independently leveling each rectangular area of the plurality of rectangular areas for each site of the plurality of sites; and
combining the plurality of rectangular areas for each site of the plurality of sites to obtain a full wafer measurement metric.

22. The system of claim 21, wherein independently leveling each site of the plurality of sites comprises fitting a single least-square best-fit plane to each site.

23. The system of claim 21, wherein independently leveling each rectangular area of the plurality of rectangular areas for each site of the plurality of sites comprises fitting a single least-square best-fit plane to each rectangular area.

24. The system of claim 21, wherein the measurement metric includes a flatness measurement metric.

25. The system of claim 24, wherein the one or more processors are further configured to:
calculate an average site-flatness value based on the combined full wafer flatness measurement metric.

26. The system of claim 25, wherein the one or more processors are further configured to:
subtract an average site-flatness value from the combined full wafer flatness measurement metric to obtain a site-to-site variation.

27. The system of claim 26, wherein the one or more processors are further configured to:
provide the site-to-site variation as a feedback control to a process tool to reduce process tool induced flatness errors.

* * * * *